United States Patent [19]

O'Shea et al.

[11] Patent Number: 4,933,745
[45] Date of Patent: Jun. 12, 1990

[54] MICROWAVE DEVICE PACKAGE

[75] Inventors: Richard L. O'Shea, Holliston; Paul J. Bourque, Everett, both of Mass.

[73] Assignee: Raytheon Company, Lexington, Mass.

[21] Appl. No.: 276,976

[22] Filed: Nov. 25, 1988

[51] Int. Cl.⁵ .................................... H01L 23/16
[52] U.S. Cl. ................................. 357/75; 357/74; 174/52.5; 333/247
[58] Field of Search ............... 357/74, 75, 81; 174/52.5; 333/245, 246, 247, 33

[56] References Cited

U.S. PATENT DOCUMENTS

| | | | |
|---|---|---|---|
| 3,886,505 | 5/1975 | Jacobson | 333/84 |
| 4,211,986 | 7/1980 | Tajima | 333/116 |
| 4,575,701 | 3/1986 | Greed | 333/328 |

FOREIGN PATENT DOCUMENTS

| | | | |
|---|---|---|---|
| 3322593 | 1/1985 | Fed. Rep. of Germany | 357/38 |
| 0071152 | 5/1982 | Japan | 357/75 |

Primary Examiner—Martin H. Edlow
Assistant Examiner—Donald L. Monin
Attorney, Agent, or Firm—Denis G. Maloney; Richard M. Sharkansky

[57] ABSTRACT

A package is provided for a pair of microwave semiconductor devices, such package comprising upper and lower mating covers, each one of such covers having bonded thereto a corresponding one of the pair of microwave semiconductor devices. With such arrangement, after the devices are bonded to the cover to form a component of the package, the effective impedance of the thus formed component is electrically characterized, or measured. Having characterized a large quantity of such components, the components are then sorted into bins with components having substantially matched characteristics being placed in a common one of the bins. Pairs of such components in a common bin are used as the upper and lower cover for the package. Thus, assembly time is significantly reduced since additional matching compensation techniques are not required.

4 Claims, 3 Drawing Sheets

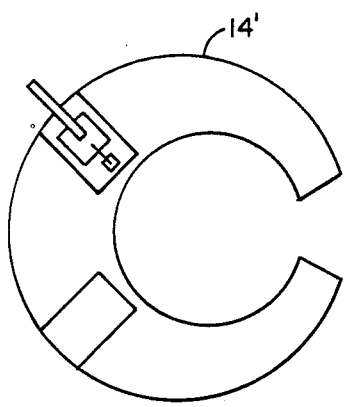
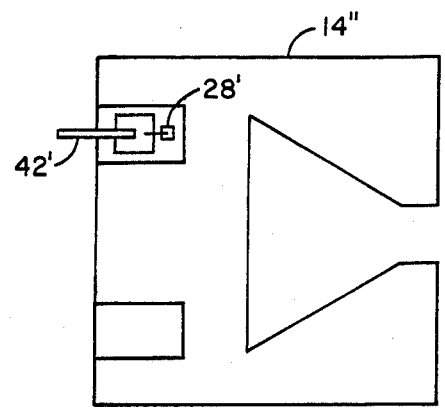
FIG. 5      FIG. 6
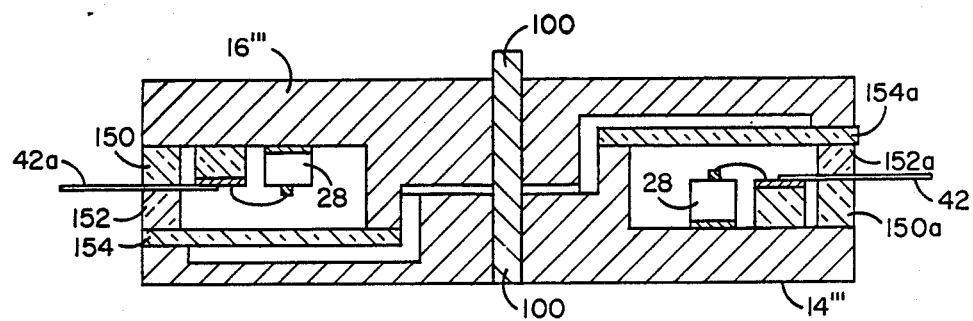
FIG. 7

MICROWAVE DEVICE PACKAGE

BACKGROUND OF THE INVENTION

This invention relates generally to packages for active microwave semiconductor devices and more particularly to packages of such type for use with the plurality of such active microwave semiconductor devices.

As is known in the art, active microwave semiconductor devices, such as p-i-n diodes and field effect transistors, are used in a wide variety of applications. In many of these applications, a pair of such devices are required. For example, in a microwave phase shifter, microwave energy is fed to a four port hybrid coupler. In such application, microwave energy is fed to an input one of the ports. A pair of p-i-n diodes terminate a corresponding pair of coupled ports. A load is coupled to an output one of the ports. The diodes may be biased to either a conducting state or a non-conducting state selectively in accordance with a DC (direct current) control voltage fed to appropriately forward or reverse bias the diodes. When microwave energy is fed to the input port and the diodes are changed from being biased from a first state, say a forward bias state, to the other state, say the reverse bias state, fed microwave energy coupled to the output port will correspondingly change in phase by 180°. In order that the phase shifter operate over a relatively wide bandwidth, the terminations provided by the pair of diodes should have substantially matched impedances over the desired operating bandwidth.

As is also known in the art, one technique used to provide these substantially matched characteristic impedances is to electrically characterize (i.e. measure) the impedances of each one of a large quantity, or supply, of diodes. The diodes are then sorted into bins, each bin containing diodes having substantially matched impedances. Then during the assembly process, pairs of diodes from the same bin are mounted together to form a phase shifter. While this technique does result in the use of matched diodes for each phase shifter, when the diodes are actually bonded to form the phase shifter parasitics are introduced in the connecting leads, for example, which result in the mismatching of the impedances intended to be terminated by the diodes. Thus, additional compensation is required to achieve the desired matched impedance characteristics. This additional compensation process adds time and hence production cost in manufacturing the phase shifter.

As is further known in the art, the same phase shifter of the type described above sometimes requires that DC biasing of the diodes be accomplished using circuitry which is decoupled from, or electrically isolated from, the microwave frequency energy fed to and coupled from the phase shifter. That is, the DC voltages must "float" from the ground planes used for the microwave energy. One technique used to provide this isolation is to include a microwave series quarter wave stub, or sector, resonant circuit coupled between a junction connected to common electrodes of the pair of diodes and the ground plane. A DC voltage is also coupled to the common junction to bias the diodes, however, the capacitive element of the series resonant circuit provides the DC "block" or isolation between the common junction and the ground plane, yet such common junction provides, at microwave frequencies, a series short circuit between the common junction and the ground plane. Therefore, when the diodes are biased to a conducting condition, the common junction is at ground and thus, provides an effective short circuit condition to the microwave energy.

As is still further known in the art, it is sometimes desirable to provide a microwave phase shifter of the type described above which is adapted to operate with relatively high power. Thus, it is required to provide a heat sink for power otherwise dissipated by the diodes. In a strip line phase shifter of the type described above, the heat sink is provided by the outer ground plane conductors. Entrapped air (air gaps) between the ground plane conductor and the diode mounting mechanism may reduce the heat sink effectiveness of the ground plane conductor. Therefore, the means for mounting the diodes must be such that good mechanical contact is provided to the ground plane to achieve good thermal contact (that is, i.e. low thermal impedance) to the ground plane heat sink.

SUMMARY OF THE INVENTION

In accordance with the present invention, a package is provided for a pair of microwave semiconductor devices, such package comprising upper and lower mating covers, each one of such covers having bonded thereto a corresponding one of the pair of microwave semiconductor devices. With such arrangement, after the devices are bonded to the cover to form a component of the package, the effective impedance of the thus formed component is electrically characterized, or measured. Having characterized a large quantity of such components, the components are then sorted into bins with components having substantially matched characteristics being placed in a common one of the bins. Pairs of such components in a common bin are used as the upper and lower cover for the package. Thus, assembly time is significantly reduced since additional matching compensation techniques are not required.

In accordance with an additional feature of the invention, each one of the mating covers is identical in configuration, thus allowing manufacture of a large production run of covers to reduce the cost of, and simplify, the manufacturing and assembling process.

In accordance with an additional feature of the invention, each one of the mating covers includes circuitry adapted to provide a quarter wave stub series tuned resonant circuit between a common terminal (to which a common electrode of the semiconductor devices are bonded) and the microwave ground plane. This common terminal is thus electrically isolated at DC from the microwave ground plane to enable DC biasing of the diodes with a voltage potential across the devices which floats, or is electrically isolated from, the ground plane used for the microwave energy fed to the devices.

In accordance with yet another feature of the invention, the package is configured with a symmetrically disposed opening therethrough to enable insertion of a mounting bolt and hence mechanical bonding of the package to the ground plane circuit to thus provide good thermal conduction for the package.

In a preferred embodiment of the invention, the microwave semiconductor devices are p-i-n diodes having common electrodes connected to the common terminal. Such package including stripline circuitry to provide a microwave phase shifter. When the microwave diodes are biased to a conducting condition by a suitable DC voltage, the thus biased diodes provide a short circuit to ground for microwave energy. On the other hand, when the diodes are biased to a nonconducting condition by an appropiate DC voltage, the common terminal appears to the microwave energy to be an open circuit.

BRIEF DESCRIPTION OF THE DRAWINGS

The above-mentioned and other features of the invention will become more apparent by reference to the following description taken in connection with the accompanying drawings in which:

FIG. 5 is a plan view of one of the upper or lower covers of a microwave package according to an alternate embodiment of the invention;

FIG. 6 is a plan view of a cover for a microwave package according to still another embodiment of the invention; and FIG. 7 is a cross-section elevation view of a microwave package having hermetically sealed therein a pair of semiconductor devices, such package being configured in accordance with a still further alternate embodiment of the invention.

DESCRIPTION OF THE PREFERRED EMBODIMENT

Figure 1:
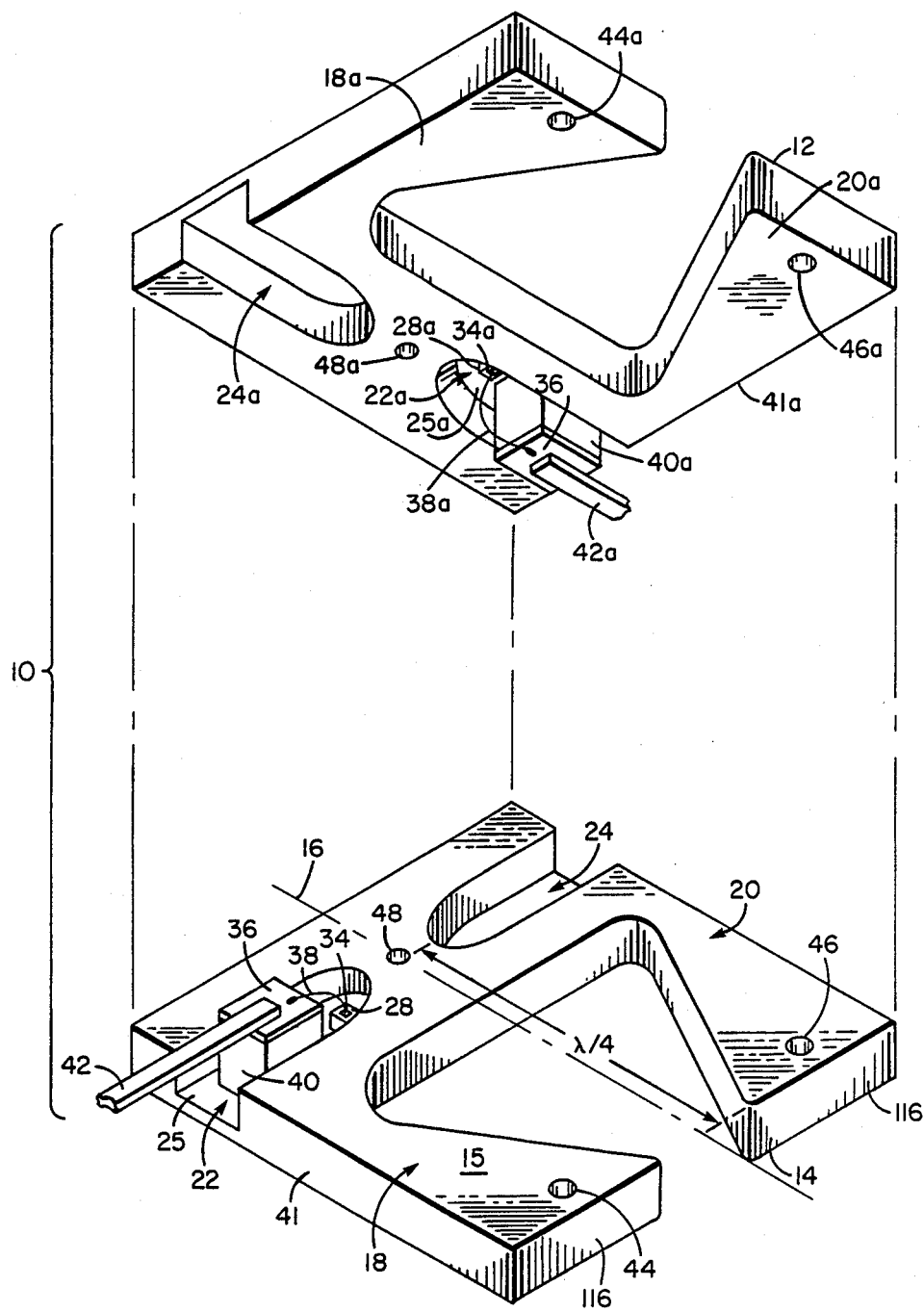
FIG. 1 is an exploded isometric view of top and bottom mating covers of a microwave package, each one of such covers having affixed thereto a microwave semiconductor device, which upper and lower mating covers, when affixed to each other, form a package having enclosed therein the pair of microwave devices, which devices, when suitably biased with a proper DC voltage, provide matched impedance loads.

Referring now to FIG. 1, a microwave device package 10 is shown to include a pair of identically configured mating upper cover 12 and lower cover 14. Covers 12, 14 are here milled or stamped from a suitable conductive material here copper. The thickness of each one of the covers 12, 14 is here 0.035 inches and the periphery is a square 0.17 inches by 0.17 inches. Considering first lower cover 14, it is noted that such cover 14 has an upper mating surface 15 disposed in a plane, such plane having right and left sections disposed symmetrically about an axis of symmetry 16. Lower cover 14 has two triangular shaped regions 18, 20 which, as will be described in detail hereinafter, provide a strip conductor portion of a strip transmission line quarter wave series resonant circuit. Milled or stamped into the upper portion of the mating surface 15 of cover 14 are a pair of grooves 22, 24. Grooves 22, 24 are identical in configuration and are disposed symmetrically about the axis of symmetry 16. Mounted to the base 25 of groove 22 is a p-i-n diode 28. More specifically, the diode 28 has its cathode (not shown in FIG. 1, but identified in FIG. 4 by numeral 30) electrically and mechanically connected to such base 25, here by solder. The anode contact 34 of the diode 28 is connected to a conductive pad 36, here a gold pad, by a conductive wire 38, here also gold. The conductive pad 36 is electrically isolated from the base 25 of groove 22 by a suitable dielectric block 40, here alumina, such block 40 here being mechanically connected to the base 25 by any suitable epoxy or solder (not shown). The conductive ribbon 42, here gold, has one end thereof extending beyond the edge 41 of the cover 14. The other end of the ribbon 42 is electrically and mechanically connected to conductive pad 36 by any suitable means, here by solder. The cover 14 has three holes 44, 46, 48 drilled through it. Holes 44 and 46 are for insertion alignment pins (not shown) and are used to press fit the covers 12, 14 together to some degree. Hole 48 is for a DC voltage probe (not shown in FIG. 1) to be described hereinafter. Completing FIG. 1, upper cover 12 is shown to have identically formed triangular sections 18a, 20a, grooves 22a, 24a, holes 44a, 46a and 48a. A diode 28a with its cathode 30a (FIG. 4) bonded to the base 25a of groove 22a and its anode 34a electrically connected to conductive pad 36a via a conductive wire 38a. The conductive pad 30a is formed on a dielectric block 40a which itself is bonded to the base 25a of groove 22a. A conductive ribbon 42a is shown bonded at one end to the conductive pad 36a and the other end extending beyond the edge 41a of upper cover 12.

It should be noted that in a manufacturing process a large quantity of covers 12, 14 are fabricated, as described, and each one has bonded to the groove formed in the left section thereof, a p-i-n diode, a dielectric block and a bonding wire. These thus formed components are provided in a large number. After having been fabricated, these components are tested for their electrical properties. In particular, a DC voltage is applied to the ribbon 42, 42a, through the conductive pad 36, 36a, and the diode 28, 28a, with the diode biased between conducting and non-conducting states so that the open circuit and short circuit impedances of the mounted diode, are measured. It is noted that, in effect, it is the entire component's impedance which is measured, including any parasitic resulting from the wire 38, 38a bonded to the diode. After these components are thus characterized, they are sorted into bins so that components having substantially identical characteristics are placed in a common bin. Each package 10 is then formed by selecting its upper and lower covers from a common bin. Thus, in FIG. 1, the package 10 is made up of a pair of components from a common bin formed for upper cover 12 and bonded p-i-n diode 28a and a lower cover 14 having bonded p-i-n diode 28. The electrical characteristic of the component performing the upper and lower covers thus have substantially identical impedance characteristics and the package thus formed provides a package for a pair of semiconductor devices having disposed therein substantially identical impedance characteristics.

Figure 2:
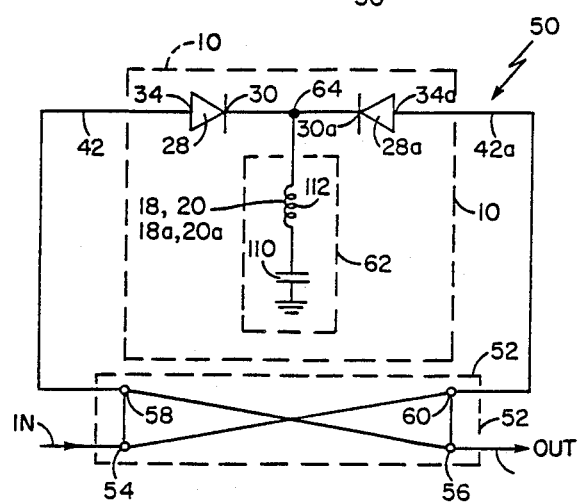
FIG. 2 is a schematic diagram of a microwave phase shifter having the microwave package of FIG. 1.

Referring now to FIG. 2, a phase shifter 50 is shown to include the microwave device package 10. Also included in the phase shifter 50 is a hybrid coupler 52. Thus, hybrid coupler 52 includes an input port 54 and an output port 56. The pair of p-i-n diodes 28, 28a, in package 10 have their anodes 34, 34a connected to coupled ports 58, 60, respectively as shown. As will be described in detail hereinafter, a series resonant circuit 62 is connected serially between a common terminal 64 (to which is connected the cathodes 30, 30a of diodes 28, 28a, respectively) and ground. Thus, microwave energy fed to input port 54 is fed in equal power via coupled ports 58 and 60 to diodes 28, 28a, respectively. Such energy will "see" either an open circuit or a short circuit impedance depending on the DC biased state of diodes 28, 28a. More specifically, when the diodes 28, 28a are forward biased to a conducting condition, the series resonant circuit will be in resonance with the fed microwave energy and hence the energy will "look" at a short cirucit, with the result that the energy will reflect "in phase" back to the output port 56. When the diodes 28, 28a are biased to a non-conducting state, the energy will "look" at an "open circuit" and will reflect "in phase" to the output port 56, however, the phase of the energy at port 56 will be 180° out of phase relative to the energy at such port 56 when the diodes were biased in the conducting state.

Figure 4:
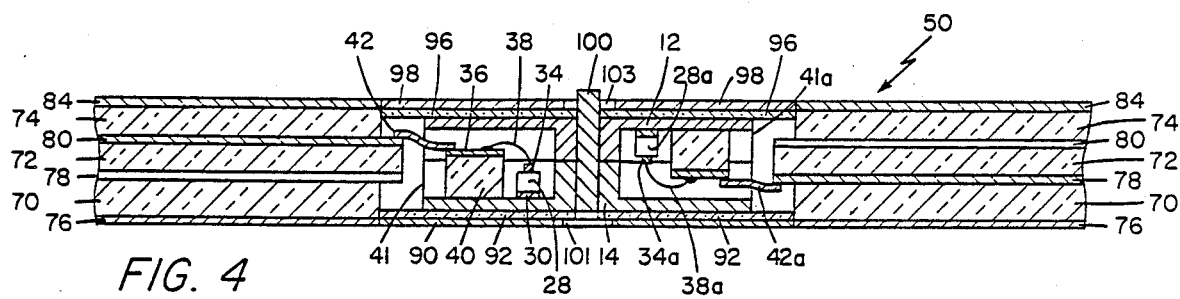
FIG. 4 is a diagramatical cross-section elevation view of the strip transmission line phase shifter of FIG. 3, the cross-section of FIG. 4 being taken along lines 4—4 of FIG. 3.
Figure 3:
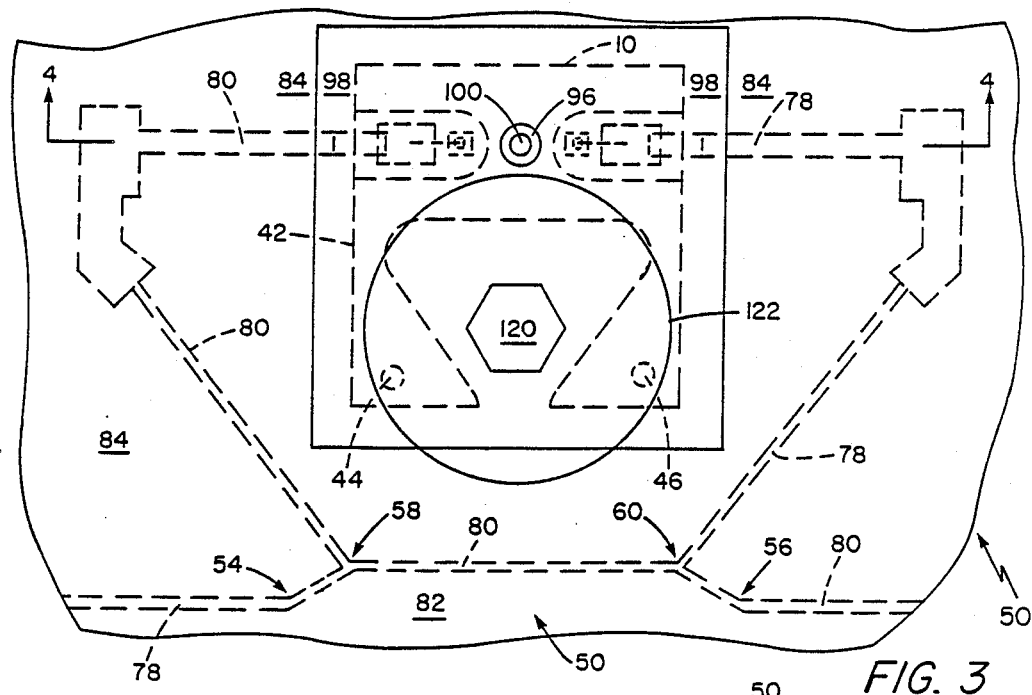
FIG. 3 is a diagramatical plan view of the microwave phase shifter schematically shown in FIG. 2.

Referring now to FIGS. 3 and 4, the phase shifter 50 is here implemented as a strip transmission line (strip line) phase shifter. Thus, the phase shifter includes three dielectric boards 70, 72, 74 (FIG. 4). The lower one of the dielectric boards, here board 70, has a conductive ground plane conductor (here copper) 76 clad to the lower surface thereof. The middle dielectric board 72 has strip conductor circuitry 78, 80 formed on the upper and lower surfaces thereof, respectively, as shown. Thus, portions of the strip conductor circuitry overlay one another, but are dielectrically separated from one another, in the coupling region 82 of the hybrid coupler 50 (FIG. 3). The upper dielectric board 74 has a ground plane conductor 84, (here copper) clad over the upper surface thereof. Once the package 10 has its upper and lower covers 12, 14 press fit together by pins (not shown) in alignment holes 44, 44a, 46, 46a (FIG. 1), a DC bias conductive probe 100 is inserted in the holes 48, 48a (FIG. 1). The conductive probe is pressfit or soldered to the top covers 12, 14 of the package 10, thereby providing a DC connection to the upper and lower covers 12, 14 of package 10. The thus assembled package 10 is inserted into a pocket formed in the stripline circuitry. The lower ground plane conductor 76 is extended, with a sheet of conductive material 90, to provide a continuous ground plane conductor for the stripline circuit. A sheet 92 of dielectric, here mica, is then placed on the ground plane material 90. The assembled package 10 has its lower cover 14 placed on the dielectric sheet 92. The conductive ribbons 42, 42a, are bonded, here by solder, to the ends of the upper strip conductor 80 and the lower strip conductor 78, respectively, as shown. A second layer 96 of dielectric, here also mica, is placed over the top of the upper cover 12 of package 10, as shown. The sheet of conducting material 98 is then used to complete the upper ground plane conductor 84 for the strip line circuit. It is noted that the conductive probe 100 is electrically insulated from the ground plane conductors 90 96 by removal of circular portions 101, 103, respectively, of such conductors around the probe 100. The thickness of the dielectric layers 92, 96, the dielectric constant of such layers together with the dielectric constant and thickness of the dielectric boards 70, 72, 74 are selected to provide, together with the configuration of triangularly regions 18, 20, 18a, 20a, the desired capacitance for the capacitive component 110 (FIG. 2) of the series resonant circuit 62. The length and width of the triangular shaped regions 18, 18a, 20, 20a are selected to provide the inductance 112 (FIG. 2) of such series resonant circuit 62. The electrical length from the common terminal regions 64 and the ends 116 of the triangular shaped regions is an electrical effective quarter wave length ($\lambda/4$) as shown in FIG. 1. Thus, the triangular shaped regions 18, 18a, 20, 20a, together with the ground plane conductors and the dielectric material disposed therebetween provide a quarter wave stub series tuned resonant circuit between the common terminal 64 and the ground planes 76, 84.

Completing the assemblies are a bolt 120 and a pair of washers 122. The package 10 has an open central region which allows for insertion of the bolt 120. The washers 122 are disposed over the upper and lower conductive ground plane conductors 90, 96. The bolt 120 and washers 122 are used to mechanically bond the package to the ground planes and thus provide good thermal conduction to the ground planes for the package.

In operation, when a DC voltage is applied between the DC bias probe 100, and the strip conductor circuitry 78, 80, depending upon the polarity of such voltage, such voltage will either forward or reverse bias the diodes 28, 28a.

Referring now to FIG. 5, a cover 14' for a package, according to an alternate embodiment of the invention, is shown to be configured with the quarter wave stubs in a round configuration, rather than a triangular shaped configuration, while FIG. 6 shows still an alternate embodiment of the invention where the cover 14", while quite similar to the covers 12, 14, shown in FIG. 1, here has, however, the diodes 28', and hence the the connecting ribbon 42', extending from the rear of the package rather than from the sides of the package, as shown. The FIG. 7 shows an alternate form of the invention wherein the package 10''' has covers 14''' and 16''' has hermetically sealed within it the diodes 28''', 28a'''. More specifically, the conductive ribbons 42, 42a pass through glass beads, 150, 152, 150a, 152a, as shown, with a hermetic cover 154, 154a positioned across the grooves as shown.

Having described preferred embodiments of the invention, it will now be apparent to one of skill in the art that other embodiments incorporating its concepts may be used. For example, while the packages have been described using p-i-n diodes, other semiconductor devices may be included within the concepts described herein. Further, the ground plane conductors 76, 84 need not be clad to dielectric layers 70, 74 but may be separate conductive sheets which are affixed after the package 10 has been inserted. This would eliminate the need for additional members 90, 96. Also, the strip conductor 42a may be bonded to a conductive pad disposed on the upper surface of dielectric layer 72 by use of a conductive feedthrough passing from strip conductor 78 vertically through dielectric layer 72 to such conductive pad for bonding to strip conductor 42a. In this way both strip conductors 42 and 42a may be bonded from the same side. It is believed, therefore, that this invention should not be restricted to the disclosed embodiments but rather should be limited only by the spirit and scope of the appended claims.

What is claimed is:

1. A package adapted for use with a pair of semiconductor devices, such package comprising:
    upper and lower mating covers, each one of such covers being substantially identical in configuration and having bonded thereto a corresponding one of the pair of the semiconductor devices; and
    wherein each one of such covers is substantially symmetrical about an axis of symmetry and each one of such pair of devices is bonded to mating face of the covers with each one of such pair of devices disposed on the same side of the axis of symmetry.

2. The package recited in claim 1 wherein each one of such covers has a pair of grooves, formed in the mating face thereof, each one of such grooves having bonded therein a corresponding one of the pair of devices.

3. The package recited in claim 1 wherein each one of the covers has integrally formed therewith a conductive member adapted to provide strip conductor circuitry for a series tuned resonant circuit.

4. The packaged recited in claim 3 wherein the conductive member is shaped with an open region and including a mounting bolt passing through said open region.

* * * * *